United States Patent
Lee

(10) Patent No.: US 7,586,797 B2
(45) Date of Patent: **\*Sep. 8, 2009**

(54) DATA OUTPUT CIRCUIT OF SYNCHRONOUS MEMORY DEVICE

(75) Inventor: Chang Hyuk Lee, Kyoungki-do (KR)

(73) Assignee: Hynix Semiconductor Inc., Kyoungki-do (KR)

( \* ) Notice: Subject to any disclaimer, the term of this patent is extended or adjusted under 35 U.S.C. 154(b) by 0 days.

This patent is subject to a terminal disclaimer.

(21) Appl. No.: 12/112,149

(22) Filed: Apr. 30, 2008

(65) Prior Publication Data

US 2008/0279034 A1 Nov. 13, 2008

Related U.S. Application Data

(63) Continuation of application No. 11/451,109, filed on Jun. 12, 2006, now Pat. No. 7,385,860.

(30) Foreign Application Priority Data

Jun. 10, 2005 (KR) ............. 10-2005-0049772
Jun. 30, 2005 (KR) ............. 10-2005-0057685

(51) Int. Cl.
*G11C 7/00* (2006.01)
(52) U.S. Cl. ............. 365/189.12; 365/194
(58) Field of Classification Search ............. 365/189.12, 365/194
See application file for complete search history.

(56) References Cited

U.S. PATENT DOCUMENTS

| 5,402,389 A | 3/1995 | Flannagan et al. |
| 5,798,969 A | 8/1998 | Yoo et al. |
| 5,835,444 A | 11/1998 | Kim et al. |

(Continued)

FOREIGN PATENT DOCUMENTS

TW 255059 8/1995

(Continued)

OTHER PUBLICATIONS

Offical Notification of Examination-TIPO dated Apr. 22, 2008.

(Continued)

*Primary Examiner*—Hoai V Ho
*Assistant Examiner*—Jason Lappas
(74) *Attorney, Agent, or Firm*—Ladas & Parry LLP

(57) ABSTRACT

A data output circuit of a synchronous memory device including a plurality of pipelatches having an N bits prefetch function. Each pipelatch comprises a data switching section for switching an output path of N bits data; a first data selection section for receiving one half of the N bits data and outputting the one half in response to a first control signal; a second data selection section for receiving the other half of the N bits data and outputting the other half in response to the first control signal; a first shifter for outputting a second control signal delayed by a first time after receiving the first control signal; and a second shifter for receiving the data outputted from the second data selection section and outputting the data with a delay of the first time in response to the second control signal.

8 Claims, 6 Drawing Sheets

U.S. PATENT DOCUMENTS 6,404,697 B1 6/2002 Ryu et al.
2004/0218429 A1* 11/2004 Shim .......................... 365/194

FOREIGN PATENT DOCUMENTS

TW 314676 9/1997
TW 411476 11/2000

OTHER PUBLICATIONS

Search Report on Patent Application No. 095120905; Filing Date Jun. 12, 2006; International Patent Classification No. (IPC): G11C7/10 (Jan. 2006) International Patent Classification (IPC) of search: G11C (Jan. 2006).

* cited by examiner

FIG.2
(PRIOR ART)

| STARTING COLUMN ADDRESS | MODE | soseb0 | pre_rd O<0> | pre_rd O<1> | pre_fd O<0> | pre_fd O<1> | seseb1_r | rdo | seseb1_f | fdo | DATA OUTPUT |
|---|---|---|---|---|---|---|---|---|---|---|---|
| 0 | SEQUENTIAL & INTERLEAVE | 0 | q0 | q2 | q1 | q3 | 0,1 | q0,q2 | 0,1 | q1,q3 | q0,q1,q2,q3 |
| 1 | INTERLEAVE | 1 | q1 | q3 | q0 | q2 | 0,1 | q1,q3 | 0,1 | q0,q2 | q1,q0,q3,q2 |
| 1 | SEQUENTIAL | 1 | q1 | q3 | q0 | q2 | 0,1 | q1,q3 | 1,0 | q2,q0 | q1,q2,q3,q0 |
| 2 | SEQUENTIAL & INTERLEAVE | 0 | q0 | q2 | q1 | q3 | 1,0 | q2,q0 | 1,0 | q3,q1 | q2,q3,q0,q1 |
| 3 | INTERLEAVE | 1 | q1 | q3 | q0 | q2 | 1,0 | q3,q1 | 1,0 | q2,q0 | q3,q2,q1,q0 |
| 3 | SEQUENTIAL | 1 | q1 | q3 | q0 | q2 | 1,0 | q3,q1 | 0,1 | q0,q2 | q3,q0,q1,q2 |

…

DATA OUTPUT CIRCUIT OF SYNCHRONOUS MEMORY DEVICE

BACKGROUND OF THE INVENTION

1. Field of the Invention

The present invention relates, in general, to a data output circuit of a synchronous memory device, and more particularly, to a data output circuit which determines an output sequence of data outputted to the outside of a memory device, depending upon a column address applied by a read command and a burst type.

2. Description of the Related Art

As is generally known in the art, in a synchronous memory device (hereinafter, referred to as a "memory device"), the data read out from a memory cell in response to a read command is amplified by a sense amplifier, is transmitted to a global bus line, and then is outputted to the outside through a pipelatch and an output driver. In this regard, the present invention lays emphasis on a method for processing data applied to the pipelatch. This method will be explained in detail below with reference to FIGS. 1 and 2.

FIG. 1 illustrates an example of a data output circuit of a conventional memory device, in particular, an example of a data output circuit having a 4 bits prefetch function. FIG. 2 is a table explaining a data output sequence determined depending upon the lower 2 bits of a column address (a starting column address) applied by a read command and a data output mode (an interleave mode or a sequential mode).

In FIG. 1, gio1<0:3>, gio2<0:3>, gio3<0:3> and gio4<0:3> represent different global bus lines. The respective global bus lines transmit 4 bits data q<0:3> to respective corresponding pipelatches 101, 102, 103 and 104.

The respective pipelatches 101, 102, 103 and 104 receive their corresponding enable signals PIN1, PIN2, PIN3 and PIN4 and a plurality of control signals ctr1, ctr2, ctr3 and ctr4.

The output signals of the respective pipelatches are inputted to a pre-driver 105. The data inputted to the pre-driver 105 are synchronized with synchronization signals rclk_do and fclk_do and then transmitted to an output driver (not shown). Here, the synchronization signals rclk_do and fclk_do are internal clock signals which are outputted from a DLL circuit in a synchronous memory device.

FIG. 3 is a concrete example of the pipelatch 101 shown in FIG. 1. For reference, the pipelatches 102, 103 and 104 are configured in the same manner as the pipelatch 101.

Referring to FIG. 3, an input terminal in1 receives data q0, an input terminal in2 receives data q1, an input terminal in3 receives data q2, and an input terminal in4 receives data q3. The data q0 through q3 represent the data applied to the pipelatch through the global bus line.

A signal soseb0 is an abbreviation of a "start odd start even bar," and the logical value of the signal soseb0 is determined by the value of the lowermost 2 bits of a column address (hereinafter, referred to as a "starting column address") applied by a read command and a data output sequence mode (see FIG. 2). For reference, the data output sequence mode is a mode for determining a data output sequence and includes a sequential mode and an interleave mode.

The enable signal PIN1 is a signal which determines whether a buffer for receiving the data q0 through q3 is to be enabled or not.

A signal soseb1_r and a signal soseb1_f are switching signals. The signal soseb1_r determines an output sequence of the data having passed through a node pre_rdo<0> and the data having passed through a node pre_rdo<1>. The signal soseb1_f determines an output sequence of the data having passed through a node pre_fdo<0> and the data having passed through a node pre_fdo<1>.

A signal rpout and a signal fpout are signals for enabling the output buffers of the pipelatch. The data on the nodes pre_rdo<0>, pre_rdo<1>, pre_fdo<0> and pre_fdo<1> are outputted through the output nodes rdo and fdo of the output buffers of the pipelatch.

In operation, for example, as shown in FIG. 2, when a starting address is "00" under the sequential mode, the signal soseb0 has a low level. In this case, as can be readily seen from FIGS. 2 and 3, the data q0 is outputted through the node pre_rdo<0>, the data q2 is outputted through the node pre_rdo<1>, the data q1 is outputted through the node pre_fdo<0>, and the data q3 is outputted through the node pre_fdo<1>.

Next, when the signal soseb1_r has a low level, the data q0 on the node pre_rdo<0> is transmitted to the node rdo through the output buffer, and when the signal soseb1_r has a high level after 1tCK, the data q2 on the node pre_rdo<1> is transmitted to the node rdo through the output buffer. Here, 1tCK means a cycle of a clock signal used in the synchronous memory device.

Similarly, when the signal soseb1_f is a low level, the data q1 on the node pre_fdo<0> is transmitted to the node fdo through the output buffer, and when the signal soseb1_f is a high level after 1tCK, the data q3 on the node pre_fdo<1> is transmitted to the node fdo through the output buffer. At this time, since the signal soseb1_f operates later than the signal soseb1_r with a delay of ½tCK, the data applied to the pre-driver 105 of FIG. 1 are applied in the sequence of q0, q1, q2 and q3. That is to say, when the starting column address is 0 and the sequential mode is used, the data applied to the pre-driver are applied in the sequence of q0, q1, q2 and q3.

In another example, when the starting column address is 3 under the interleave mode, the data q1 is transmitted to the node pre_rdo<0>, the data q3 is transmitted to the node pre_rdo<1>, the data q0 is transmitted to the node pre_fdo<0>, and the data q2 is transmitted to the node pre_fdo<1>. In this case, the signal soseb1_r maintains a high level at the start and maintains a low level after 1tCK. Also, the signal soseb1_f which is outputted later than the signal soseb1_r with a delay of ½tCK maintains a high level at the start and maintains a low level after 1tCK. Accordingly, the data q3 and q1 are sequentially outputted through the node rdo, and the data q2 and q0 are sequentially outputted through the node fdo. As a result, the data are applied to the pre-driver in the sequence of q3, q2, q1 and q0.

The operation of each of the remaining pipelatches 102 through 104 shown in FIG. 1 is the same as that explained with respect to FIG. 3. However, depending upon the enable timings of the enable signals PIN2, PIN3 and PIN4 applied to the respective pipelatches 102 through 104, the operation times of the pipelatches are differentiated. Generally, since the output nodes rdo and fdo of the pipelatches shown in FIG. 1 are commonly used, the enable signals PIN1 through PIN4 are sequentially enabled without being overlapped with one another and operate the respective pipelatches. For reference, the data outputted from the circuit of FIG. 1 and applied to the data output buffer (not shown) is outputted to the outside through one data pin. Therefore, when the number of the data pins is N, it means that the circuit of FIG. 1 exists in the number of N.

The signals soseb1_r, soseb1_f, rpout and fpout described with respect to FIG. 3 are independent signals individually applied to the respective pipelatches. Hence, while not shown in the drawings, the circuits for generating the signals soseb1_r, soseb1_f, rpout and fpout transmit the signals to the pipelatches using 16 signal lines.

However, as described above, since the respective pipelatches which constitute the conventional data output circuit explained with respect to FIGS. 1 and 3 use the independent signals soseb1_r, soseb1_f, rpout and fpout corresponding to them, it is essential to locate the signal lines for transmitting these signals. For example, when the number of data pins is N, 16×N signal lines are located. As a consequence, a problem is caused in that the layout efficiency of a highly integrated memory device is deteriorated.

SUMMARY OF THE INVENTION

Accordingly, the present invention has been made in an effort to solve the problems occurring in the related art, and an object of the present invention is to provide means for efficiently using a layout area through decreasing the number of signals used for the control of a data output circuit.

In order to achieve the above object, according to one aspect of the present invention, there is provided a data output circuit of a synchronous memory device including a plurality of pipelatches having an N bits prefetch function, each pipelatch comprising a data switching section for receiving N bits data and switching an output path of the N bits data depending upon a starting column address applied by a read command and a data output mode; a first data selection section for receiving one half of the N bits data outputted from the data switching section and sequentially outputting the one half of the N bits data in response to a first control signal; a second data selection section for receiving the other half of the N bits data outputted from the data switching section which remains by excluding the one half applied to the first data selection section and sequentially outputting the other half of the N bits data in response to the first control signal; a first shifter for outputting a second control signal delayed by a first time after receiving the first control signal; and a second shifter for receiving the data outputted from the second data selection section and outputting the data with a delay of the first time in response to the second control signal.

According to another aspect of the present invention, the pipelatch further comprises a pre-driver for receiving the data sequentially outputted from the first data selection section and the data sequentially outputted from the second shifter, wherein the data outputted from the first data selection section and the data outputted from the second shifter are alternately applied to the pre-driver.

According to another aspect of the present invention, the first time corresponds to a half (½tCK) of a cycle (tCK) of a clock signal applied to the synchronous memory device, and a time at which the data is initially outputted from the second data selection section is earlier by ½tCK than a time at which the data is initially outputted from the first data selection section.

According to another aspect of the present invention, the first data selection section is composed of a first switching part which is turned on and off by a third control signal and a first buffer of which enabled or disabled state is determined by the first control signal; the second data selection section is composed of a second switching part which is turned on and off by a fourth control signal and a second buffer of which enabled or disabled state is determined by the first control signal; the first and second switching parts receive the data outputted from the data switching section; data having passed through the first switching part is applied to the first buffer; data having passed through the second switching part is applied to the second buffer; an output of the first buffer is an output of the first data selection section; and an output of the second buffer is an output of the second data selection section.

According to still another aspect of the present invention, the plurality of pipelatches commonly use the first control signal.

According to yet still another aspect of the present invention, the plurality of pipelatches share the pre-driver.

BRIEF DESCRIPTION OF THE DRAWINGS

The above objects, and other features and advantages of the present invention will become more apparent after a reading of the following detailed description when taken in conjunction with the drawings, in which:

FIG. 2 is a table explaining a data output sequence determined depending upon the lower 2 bits of a column address (a starting column address) applied on a read command and a data output mode (an interleave mode or a sequential mode);

DETAILED DESCRIPTION OF PREFERRED EMBODIMENTS

Figure 1:
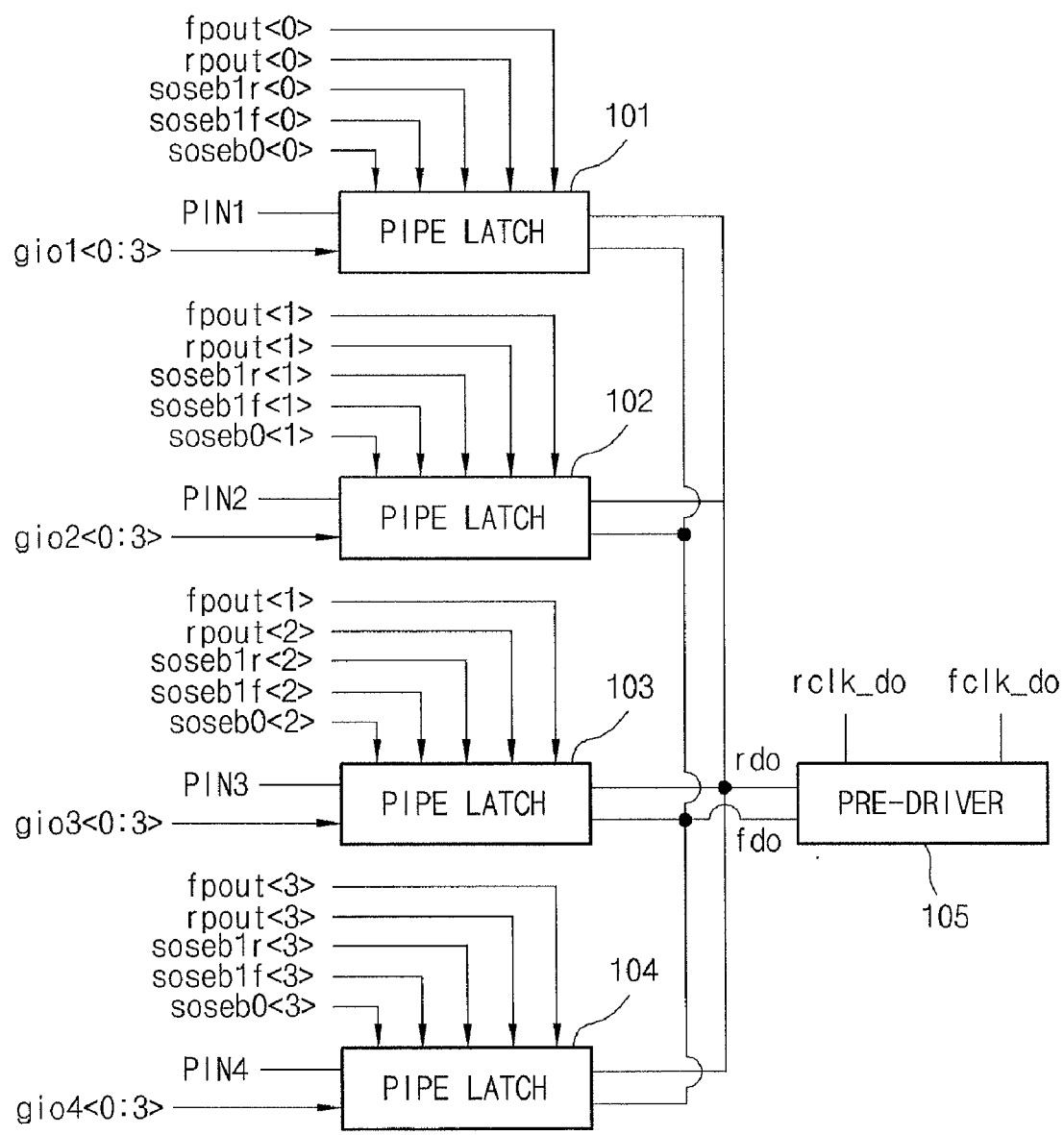
FIG. 1 illustrates an example of a data output circuit of a conventional memory device.

Reference will now be made in greater detail to a preferred embodiment of the invention, an example of which is illustrated in the accompanying drawings. Wherever possible, the same reference numerals will be used throughout the drawings and the description to refer to the same or like parts.

The present invention is characterized by the configuration of a pipelatch and the signals applied to the pipelatch in the basic circuit block shown in FIG. 1. Otherwise separately explained, in FIGS. 3, 4a and 4c, the signals denoted by the same reference numerals perform the same functions. For reference, since the pipelatch according to the present invention can be applied to the circuit block of FIG. 1, the descriptions given below will be concentrated on the configuration and the operation of the pipelatch which constitutes the characterizing feature of the present invention.

Figure 4A:
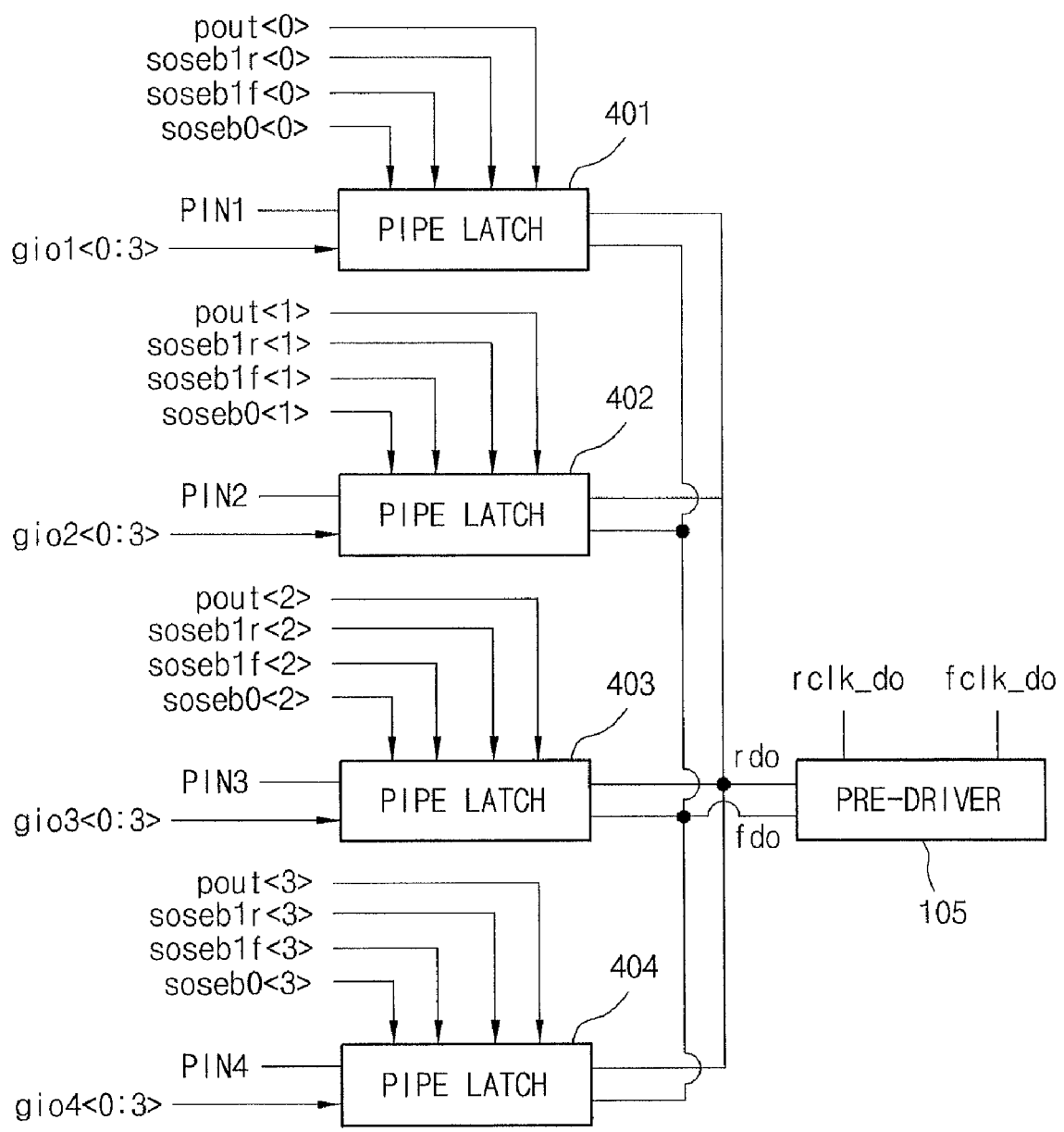
FIGS. 4a, 4b and 4c are an example of a data output circuit in accordance with an embodiment of the present invention.
Figure 4B:
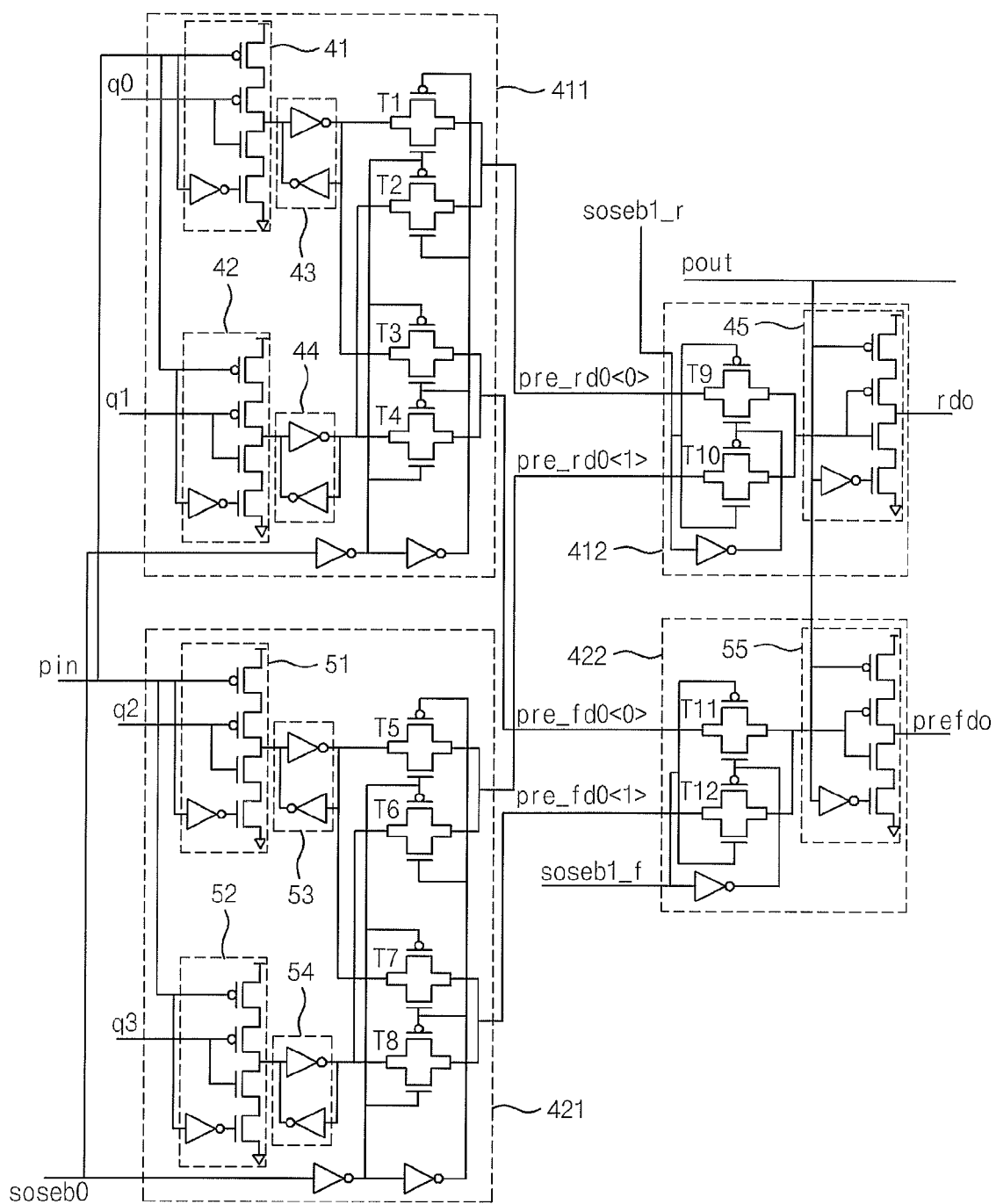

FIGS. 4a and 4b are an example of a data output circuit in accordance with an embodiment of the present invention.

Referring to FIGS. 4a and 4b, the pipelatch comprises data switching sections 411 and 421, data selection sections 412 and 422, and shifters 431 and 432.

The data switching section 411 includes buffers 41 and 42, latches 43 and 44 and switches T1 through T4.

The buffer 41 receives the data q0 transmitted through a global bus line, and the buffer 42 receives the data q1 transmitted through a global bus line. The buffers 41 and 42 function as inverters for inverting the logic level of inputted data. As shown in the drawing, whether or not the buffers 41 and 42 are operated is determined by an enable signal PIN. That is to say, when the enable signal PIN is a low level, the buffers 41 and 42 are enabled, and when the enable signal PIN is a high level, the buffers 41 and 42 are disabled.

The latch 43 is a circuit for receiving and holding the signal outputted from the buffer 41. The latch 44 is a circuit for receiving and holding the signal outputted from the buffer 42. As shown in the drawing, the latches 43 and 44 invert and hold the logic level of the received data.

The switches T1 through T4 are controlled by a turn-on/off signal soseb0. Here, the signal soseb0 is the same as that described in the background part of the present specification.

That is to say, the signal soseb0 is an abbreviation of a "start odd start even bar," and the logical value of the signal soseb0 is determined by the value of the lowermost 2 bits of a column address (hereinafter, referred to as a "starting column address") applied by a read command and a data output sequence mode.

As can be seen from the drawing, the switches T1 and T4 are turned on when the signal soseb0 is a low level and are turned off when the signal soseb0 is a high level. The switches T2 and T3 are turned on when the signal soseb0 is a high level and are turned off when the signal soseb0 is a low level. The output node of the latch 43 is connected to the input nodes of the switches T1 and T3, and the output node of the latch 44 is connected to the input nodes of the switches T2 and T4. The output nodes of the switches T1 and T2 are commonly connected with each other, and the output nodes of the switches T3 and T4 are commonly connected with each other. Accordingly, for example, when the signal soseb0 is at the low level, the switches T1 and T4 are turned on and the switches T2 and T3 are turned off. Therefore, the data stored in the latch 43 is outputted to the output node of the switch T1, and the data stored in the latch 44 is outputted to the output node of the switch T2. On the contrary, when the signal soseb0 is at the high level, the switches T1 and T4 are turned off and the switches T2 and T3 are turned on. Therefore, the data stored in the latch 44 is outputted to the output node of the switch T2, and the data stored in the latch 43 is outputted to the output node of the switch T3.

The data switching section 421 includes buffers 51 and 52, latches 53 and 54 and switches T5 through T8.

The buffer 51 receives the data q2 transmitted through a global bus line, and the buffer 52 receives the data q3 transmitted through a global bus line. The buffers 51 and 52 function as inverters for inverting the logic level of inputted data. As shown in the drawing, whether or not the buffers 51 and 52 are operated is determined by the enable signal PIN. That is to say, when the enable signal PIN is a low level, the buffers 51 and 52 are enabled, and when the enable signal PIN is a high level, the buffers 51 and 52 are disabled.

The latch 53 is a circuit for receiving and holding the signal outputted from the buffer 51. The latch 54 is a circuit for receiving and holding the signal outputted from the buffer 52. As shown in the drawing, the latches 53 and 54 invert and hold the logic level of the received data.

The switches T5 through T8 are controlled by the turn-on/off signal soseb0. Here, the signal soseb0 is the same as that described in the background part of the present specification. As can be seen from the drawing, the switches T5 and T8 are turned on when the signal soseb0 is a low level and are turned off when the signal soseb0 is a high level. The switches T6 and T7 are turned on when the signal soseb0 is a high level and are turned off when the signal soseb0 is a low level. The output node of the latch 53 is connected to the input nodes of the switches T5 and T7, and the output node of the latch 54 is connected to the input nodes of the switches T6 and T8. The output nodes of the switches T5 and T6 are commonly connected with each other, and the output nodes of the switches T7 and T8 are commonly connected with each other. Accordingly, for example, when the signal soseb0 is at the low level, the switches T5 and T8 are turned on and the switches T6 and T7 are turned off. Therefore, the data stored in the latch 53 is outputted to the output node of the switch T5, and the data stored in the latch 54 is outputted to the output node of the switch T6. On the contrary, when the signal soseb0 is at the high level, the switches T5 and T8 are turned off and the switches T6 and T7 are turned on. Therefore, the data stored in the latch 54 is outputted to the output node of the switch T6, and the data stored in the latch 53 is outputted to the output node of the switch T7.

The data selection section 412 includes switches T9 and T10 and a buffer 45.

The input node of the switch T9 is connected to the common output node pre_rdo<0> of the switches T1 and T2, and the input node of the switch T10 is connected to the common output node pre_rdo<1> of the switches T5 and T6. The switches T9 and T10 are turned on and off by a control signal soseb1_r. That is to say, when the control signal soseb1_r is a high level, the switch T10 is turned on and the switch T9 is turned off, and when the control signal soseb1_r is a low level, the switch T9 is turned on and the switch T10 is turned off. The output nodes of the switches T9 and T10 are commonly connected with each other.

The buffer 45 functions as an inverter for inverting the logic level of the signal applied thereto. As shown in the drawing, whether or not the buffer 45 is operated is determined by an enable signal pout. That is to say, when the enable signal pout is a low level, the buffer 45 is enabled, and when the enable signal pout is a high level, the buffer 45 is disabled. The input node of the buffer 45 is connected to the common output node of the switches T9 and T10.

The data selection section 422 includes switches T11 and T12 and a buffer 55.

The input node of the switch T11 is connected to the common output node pre_fdo<0> of the switches T3 and T4, and the input node of the switch T12 is connected to the common output node pre_fdo<1> of the switches T7 and T8. The switches T11 and T12 are turned on and off by a control signal soseb1_f. That is to say, when the control signal soseb1_f is a high level, the switch T12 is turned on and the switch T11 is turned off, and when the control signal soseb1_f is a low level, the switch T11 is turned on and the switch T12 is turned off. The output nodes of the switches T11 and T12 are commonly connected with each other.

The buffer 55 functions as an inverter for inverting the logic level of the signal applied thereto. As shown in the drawing, whether or not the buffer 55 is operated is determined by the enable signal pout. That is to say, when the enable signal pout is a low level, the buffer 55 is enabled, and when the enable signal pout is a high level, the buffer 55 is disabled. The input node of the buffer 55 is connected to the common output node of the switches T11 and T12.

The shifter 431 includes a buffer 61 and a latch 62.

The operation of the buffer 61 is controlled by an internal clock signal clk. The internal clock signal clk is a signal which is synchronized with an external clock signal applied to the memory device. When the internal clock signal clk is a high level, the buffer 61 is disabled, and when the internal clock signal clk is a low level, the buffer is enabled.

The signal pout for determining whether the buffers 45 and 55 are enabled or disabled is used as the input signal of the buffer 61. The output signal of the buffer 61 is stored in the latch 62. The latch 62 inverts the level of the output signal of the buffer 61 and holds the inverted level.

The shifter 431 outputs the signal pout by delaying a half clock. Therefore, the output signal control of the latch 62 corresponds to the signal which is obtained by delaying the signal pout through a half clock. Here, the half clock means ½tCK, and tCK means the cycle of the clock signal used in the synchronous memory device.

The shifter 432 includes a latch 63 and a buffer 64.

The input node of the latch 63 is connected to the output node prefdo of the buffer 55. The latch 63 inverts the logic level of the signal applied through the output node prefdo and holes the inverted logic level.

The buffer 64 is a circuit performing the function of an inverter. The operation of the buffer 64 is controlled by the output signal control of the latch 62. When the signal control is a high level, the buffer 64 is disabled, and when the signal control is a low level, the buffer 64 is enabled. The input node of the buffer 64 is connected to the output node of the latch 63.

Similarly to the shifter 431, the shifter 432 outputs the data applied thereto through the node prefdo to a node fdo by delaying a half clock.

Figure 3:
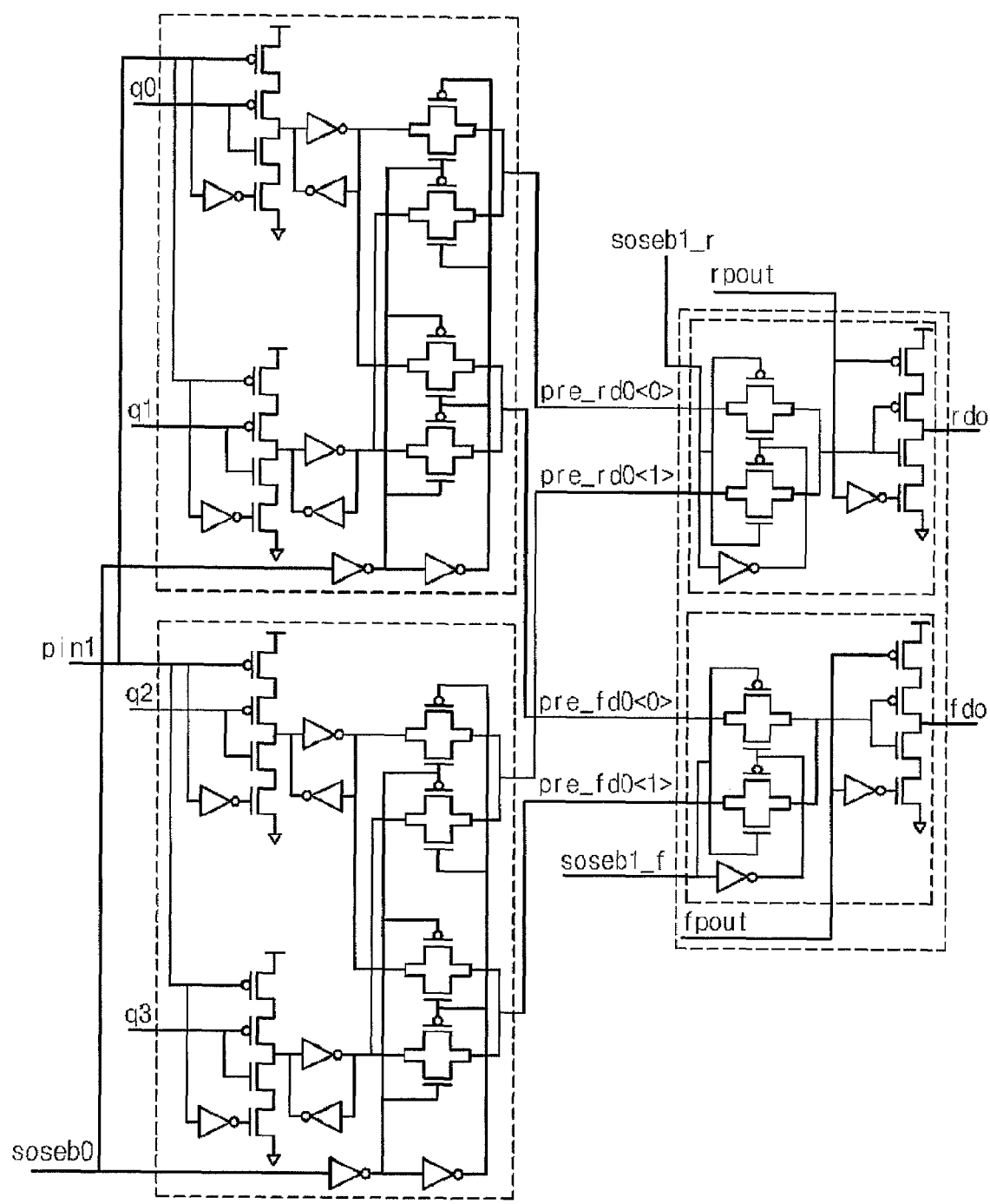
FIG. 3 is a concrete example of the pipelatch shown in FIG. 1.
Figure 4C:
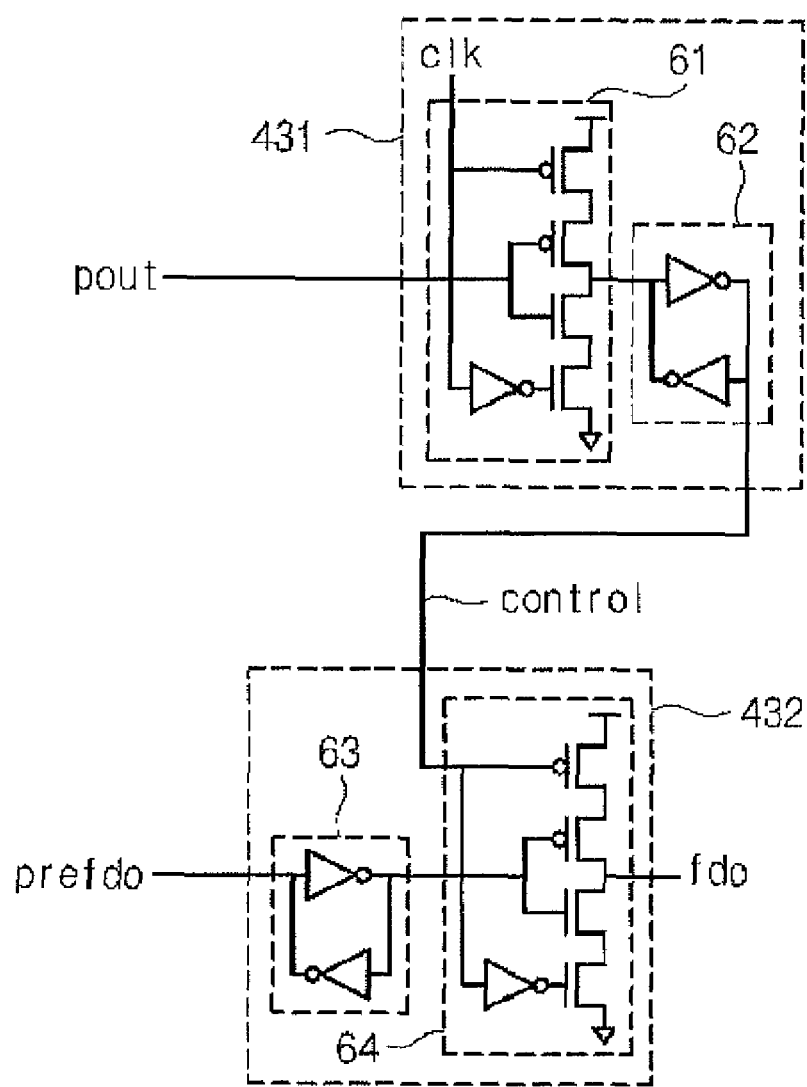

The operation of the pipelatch shown in FIGS. 4a and 4b is the same as that shown in FIG. 3.

For example, when the starting column address is "0" under the sequential mode, the data applied to the pipelatch are outputted in the sequence of q0, q1, q2 and q3. The interval between the outputted data is a half clock. That is to say, the data q0 is outputted through a node rdo, data q1 is outputted through the node fdo, the data q2 is outputted through the node rdo, and the data q3 is outputted through the node fdo. Also, when the starting column address is "3" under the interleave mode, the data applied to the pipelatch are outputted in the sequence of q3, q2, q1 and q0. The interval between the outputted data is a half clock. That is to say, the data q3 is outputted through the node rdo, data q2 is outputted through the node fdo, the data q1 is outputted through the node rdo, and the data q0 is outputted through the node fdo. Namely, the operation of the circuit shown in FIGS. 4a and 4b is implemented in the same manner as shown in FIG. 2. Therefore, the operation is the same as that shown in FIG. 3 which illustrates the conventional circuit.

Hereafter, the differences between the pipelatch according to the present invention and the conventional pipelatch described with respect to FIG. 3 will be concretely described.

In the conventional art shown in FIG. 3, in order to control the operation of the final output buffers, two signals rpout and fpout are used for each pipelatch. On the contrary, in the present invention shown in FIGS. 4a and 4b, the operation of the buffers 45 and 55 are controlled using one signal pout. Accordingly, if the number of pipelatches is 4, in the present invention, when controlling the operation of the buffers, it is possible to reduce 4 signal lines in comparison with the conventional art. For reference, since the circuit shown in FIG. 1 is connected to one data pin, when the number of data pins is N, it is possible to reduce 4×N signal lines.

Next, while the signals soseb1_r<0:3> and soseb1_f<0:3> are used for each pipelatch, in the present invention, the signals soseb1_r and soseb1_f are commonly used for all pipelatches. Accordingly, when the number of pipelatches is 4, it is possible to reduce 6 signal lines in comparison with the conventional art. As a result, when the number of data pins is N, it is possible to reduce 6×N signal lines.

Further, in the conventional art, in order to control a data output sequence, the signals rpout and fpout are enabled at an interval of ½tCK. That is to say, the signals are enabled in the order of rpout→fpout→rpout→fpout. However, in the present invention, in order to ensure that data is outputted through the node fdo a ½tCK after the data is outputted to the node rdo by the signal pout, the half clock shifter 431 is employed to delay the signal pout by a half clock. That is to say, after generating the signal control by delaying the signal pout by the half clock, the signal control is used as the enable signal of another half clock shifter 432. In the present invention, the signal soseb1_f is generated a half clock before the signal soseb1_r. As a consequence, the data outputted through the node fdo is outputted in a state in which it is half-clock delayed than the data outputted through the node rdo. Hence, the sequence of the data outputted through the nodes rdo and fdo is the same as that in the case of FIG. 3.

For reference, in the present invention, while the half-clock shifters 431 and 432 are additionally located for each pipelatch, the increase in area occupied by the shifters is insignificant when compared to the decrease in area due to the reduction in the number of control signal lines.

The aforementioned pipelatch according to the present invention can be applied to the circuit shown in FIG. 1. As described in the background part of the present specification, the circuit shown in FIG. 1 corresponds to one data pin. Accordingly, the data sequentially outputted in the circuit of the present invention are sequentially inputted to data output buffers (not shown) and then outputted to the outside through data pins. For reference, the data output buffers are circuits for receiving the output signal of the pre-driver as described with respect to FIG. 1.

As is apparent from the above description, when the pipelatches of the present invention are used, as the number of signal lines associated with the pipelatches is decreased, a layout area can be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A data output circuit of a synchronous memory device including a plurality of pipelatches having an N bits prefetch function, each pipelatch comprising:

a data switching section receiving N bits data, determining the outputting order of the N bits data depending upon a starting column address applied by a read command and a data output mode, and outputting the N bits data;

a data selection section receiving the N bits data outputted from the data switching section, selecting some of the N bits data in response to first and second data selection signals, and outputting the N bits data in response to a first output enable signal; and a shifter receiving a signal selected by the second selection signal of data outputted from the data selection section and outputted, and outputting a received signal with a delay of prescribed time in response to the first outputting enable signal.

2. The data output circuit as set forth in claim 1, wherein the data selection section comprises a data switching section receiving N bits data and switching an output path of the N bits data depending upon a starting column address applied by a read command and a data output mode;

a first data selection section receiving one half of the N bits data outputted from the data switching section and sequentially selecting the one half of the N bits data in response to the first selection signal;

a second data selection section receiving the other half of the N bits data outputted from the data switching section which remains by excluding the one half applied to the first data selection section and sequentially selecting the other half of the N bits data in response to the second data selection signal.

3. The data output circuit as set forth in claim 2, wherein the shifter comprises
- a first shifter for outputting a second output enable signal delayed by the prescribed time after receiving the first output enable signal; and
- a second shifter for receiving the data outputted from the second data selection section and outputting the data with the delay in response to the second output enable signal.

4. The data output circuit as set forth in claim 3, further comprising:
- a pre-driver for receiving the data sequentially outputted from the first data selection section and the data sequentially outputted from the second shifter, wherein the data outputted from the first data selection section and the data outputted from the second shifter are alternately applied to the pre-driver.

5. The data output circuit as set forth in claim 3, wherein the prescribed time corresponds to a half (½tCK) of a cycle (tCK) of a clock signal applied to the synchronous memory device, and
the time at which the data is initially outputted from the second data selection section is earlier by ½tCK than a time at which the data is initially outputted from the first data selection section.

6. The data output circuit as set forth in claim 3, wherein the first data selection section comprises a first switching part which is turned on and off by the first control signal and a first buffer of which enabled or disabled state is determined by the first output enable signal;
- wherein the second data selection section comprises a second switching part which is turned on and off by the second control signal and a second buffer of which enabled or disabled state is determined by the first output enable signal;
- wherein the first and second switching parts receive the data outputted from the data switching section; data having passed through the first switching part is applied to the first buffer.

7. The data output circuit as set forth in claim 1, wherein the plurality of pipelatches commonly use the first output enable signal.

8. The data output circuit as set forth in claim 4, wherein the plurality of pipelatches share the pre-driver.

* * * * *